United States Patent
Jaehne et al.

(10) Patent No.: US 6,891,439 B2
(45) Date of Patent: May 10, 2005

(54) CIRCUIT AND A METHOD FOR CONTROLLING THE BIAS CURRENT IN A SWITCHED CAPACITOR CIRCUIT

(75) Inventors: Rolf Jaehne, Ottendorf-Okrilla (DE); Lutz Dathe, Dresden (DE); Andreas Huschka, Dresden (DE)

(73) Assignee: Advanced Micro Devices, Inc., Sunnyvale, CA (US)

( * ) Notice: Subject to any disclaimer, the term of this patent is extended or adjusted under 35 U.S.C. 154(b) by 107 days.

(21) Appl. No.: 10/361,087

(22) Filed: Feb. 7, 2003

(65) Prior Publication Data

US 2004/0085135 A1 May 6, 2004

(30) Foreign Application Priority Data

Nov. 4, 2002 (DE) ......................................... 102 51 308

(51) Int. Cl.[7] ................................................. H03F 3/04
(52) U.S. Cl. ........................................... 330/296; 330/9
(58) Field of Search .............................. 330/9, 51, 141, 330/288, 296, 285; 327/345, 344, 554, 124

(56) References Cited

U.S. PATENT DOCUMENTS

| | | | |
|---|---|---|---|
| 5,414,392 A | | 5/1995 | Schupak |
| 5,545,972 A | * | 8/1996 | Kiehl .......................... 323/315 |
| 5,892,402 A | * | 4/1999 | Tsubaki et al. ............. 330/288 |
| 5,986,508 A | * | 11/1999 | Nevin ......................... 330/296 |
| 6,529,080 B1 | * | 3/2003 | Seymour et al. ............ 330/296 |

OTHER PUBLICATIONS

Tietze, U.; Schenk, Ch.: Halbleiter–Schaltungstechnik, 11th ed., Berlin [among others]: Springer, 1999, pp. 319–324, 545–549, 893–896, ISBN 3–540–64192.0.

* cited by examiner

Primary Examiner—Khanh Van Nguyen
(74) Attorney, Agent, or Firm—Meyertons Hood Kivlin Kowert & Goetzel, P.C.; B. Noël Kivlin

(57) ABSTRACT

A tunable constant GM circuit allows to compensate for temperature and process variations with high precision by correspondingly adjusting a resistance value and/or the ratio of transistor widths. Thus, in switched capacitor circuits the frequency behaviour, such as the settling time, may be controlled by providing a compensated bias to the transconductance amplifiers typically used in these circuits.

21 Claims, 4 Drawing Sheets

CIRCUIT AND A METHOD FOR CONTROLLING THE BIAS CURRENT IN A SWITCHED CAPACITOR CIRCUIT

FIELD OF THE PRESENT INVENTION

Generally, the present invention relates to integrated circuits including active components, such as transconductance amplifiers, and switched capacitors that may selectively be connected to the transconductance amplifiers to compensate for temperature and process variations.

DESCRIPTION OF THE PRIOR ART

In many electronic applications involving the processing of analog signals it is commonly desirable to estimate the frequency behaviour of the circuitry or certain portions thereof. One representative example in this respect are active filter circuits including a plurality of resistors and capacitors connected to a plurality of operational amplifiers, which are in many cases configured as operational transconductance amplifiers (OTA). As is well known in manufacturing circuit elements such as resistors and capacitors unavoidable process variations may lead to significant deviations from a desired design value for the circuit elements. Moreover, any changes in the environmental conditions, such as temperature variations, may also significantly affect the characteristics of passive circuit elements. In a similar way, process variations and changing environmental conditions may have an influence on the active circuitry, such as the operational transconductance amplifiers, although the design thereof aims to minimize the influence of process and temperature fluctuations. In practice it turns out, however, that for example the frequency behaviour of the operational transconductance amplifiers is substantially defined by the load capacitance applied to the amplifier and the transconductance GM of the input transistors of the differential input of the amplifier. The value of the transconductance GM, however, may significantly vary owing to technological variations in manufacturing the operational transconductance amplifier and temperature effects, resulting in a variation of GM in the range of approximately −50 to +100 percent with respect to the design value. In many applications a respective range of variations in the frequency behaviour of the amplifiers is not acceptable, especially in applications requiring a specified and stable settling time of the amplifiers, as is the case in switched capacitor circuits required for example for filter applications and the like.

In order to obtain proper function of the operational transconductance amplifiers a bias current supplied thereto is adjusted so that the operational stability of the amplifier is ensured over the entire range of possible variations of the transconductance GM and the load capacitance. Consequently, relatively high bias currents have to be supplied to the amplifiers, which frequently remarkably exceed the bias current that would actually be required for a specific operating condition defined by the environmental situation of the circuit and the corresponding process variations during the fabrication of the circuit. Since high bias currents may not be acceptable in many applications, such as switched capacitor circuits in mobile devices, for example in mobile 'phones, portable computers, and the like, efforts are made to reduce the effect of temperature variations of the frequency behaviour of operational transconductance amplifiers. One way to control the temperature behaviour of the amplifier and to substantially compensate for any temperature effects is the provision of a so-called constant GM circuit, which produces a current flowing through a transistor having a GM that is substantially independent from the temperature and only depends on the resistor having a significantly smaller variation. By manufacturing this transistor in a similar fashion as the input transistors of the transconductance amplifiers of interest, the input stage of these amplifiers may be biased by a current originating from a transistor having a substantially constant GM.

In addition to the variation of the transconductance GM, there are also variations of the capacitance of the capacitor elements provided in the switched capacitor circuit and of the sheet resistance of the resistive material. The capacitance or the specific capacitance in the circuit and the sheet resistance define a circuit inherent RC time constant that is frequently used to define the frequency behaviour of other circuit portions such as filters and the like. For a stable operation of the switched capacitor circuit it is advantageous to determine the currently prevailing RC time constant and tune the switched capacitors, for example provided in the feedback network of an active filter portion, such that the required design value for GM/C=RC time constant is approximately maintained. Determining the circuit inherent RC time constant may be accomplished by using a constant external clock signal.

With reference to FIG. 1, a typical conventional example for a switched capacitor circuit including a constant GM circuit and an RC time constant tuning circuit will now be described to explain the problems of technological and environmental variations in more detail.

In FIG. 1, a switched capacitor circuit 100 comprises an RC tuning circuit 110, an active filter circuit 150 and a constant GM circuit 170. The active filter circuit 150 comprises a plurality of operational transconductance amplifiers 151a . . . 151n, each including a differential input stage 152 having formed therein an input transistor pair (not shown) with a specified transistor length, i.e. gate length, and a transistor width. As previously noted, the transconductance of the amplifiers 151a . . . 151n is substantially determined by the differential input stage 152 and is substantially the same for each of the amplifiers 151a . . . 151n, as these devices are manufactured under substantially the same process conditions and operate under substantially the same conditions. The active filter circuit 150 further comprises an RC feedback network 153, represented by a switched capacitor 154 activated by a clock source clk (not shown) and a plurality of capacitors 155 at least some of which are selectively connectible within the feedback network 153 by switches 156. It should be noted that the active filter circuit 150 is only of illustrative nature and is to represent any circuit including a plurality of switchable capacitors.

The RC tuning circuit 110 comprises a measurement capacitor $C_t$ and a measurement resistor $R_t$ coupled to respective constant current sources to impress identical currents into $C_t$ and $R_t$. A control circuit 111 includes a comparator circuit 112 that is configured to receive measurement signals indicative of respective voltage drops across $C_t$ and $R_t$. The comparator circuit 112 is connected to a control logic 113 having a control output 114 connected to the switches 156.

The constant GM circuit 170 comprises a regulation circuit 171 including a pair of adjustable constant current sources 172, 173 configured to adjust the currents such that an identical voltage drop at outputs of the constant current sources 172 and a reference voltage node 174 is obtained. A bias current source 175 in the regulation circuit 171 is configured to output a bias current substantially identical to the currents provided by the constant current sources 172, 173. The constant GM circuit 170 further comprises a first transistor 177 having a design length that is substantially the same as the design length of the transistors in the input stages 152 of the amplifiers 151a . . . 151n. The first transistor 177 further has a transistor width W, that may be substantially equal to the width of the input transistors of the input stages 152. A second transistor 176 has substantially the same transistor length than the first transistor 177, whereas a width of the second transistor 176 is greater than that of the first transistor 177 and may be defined by a number A that is greater than one. The gates of the first and second transistors 177, 176 are connected to each other and are also connected to the adjustable reference voltage 173. The source of the second transistor 176 is connected to a resistor 178 the other terminal of which is connected to the source of the first transistor 177 and is also connected to a reference voltage node 174. The drains of the first and second transistors 177, 176 each are connected to a respective one of the adjustable constant current sources 172.

It can be shown that the transconductance GM of for example the first transistor 177 merely depends on the number A, i.e. the ratio of the transistor widths, and the resistor 178, once an identical current is generated through the first and second transistors 177, 176 for a given gate voltage supplied by the reference voltage 173. Since the ratio of the transistor widths of the first and second transistors 177, 176, i.e. the number A, may substantially not vary with different temperatures, the transconductance GM may be considered as being substantially determined by the resistance R of the resistor 178 according to: GM~1/R.

Thus, the frequency behaviour of the amplifiers 151a . . . 151n, which will be referred to as $F_t$, substantially depends on the resistance value R and on the capacitive load seen by the respective amplifier 151a . . . 151n. The frequency behaviour may therefore be expressed as:

$$F_t \sim 1/RC,$$

wherein C represents the capacitive load of a respective amplifier.

In many applications it is important to have a $F_t$ within a well defined range so as to provide for well defined circuit conditions, such as the settling time of the active filter circuit 150 as is required, for example, in receiver devices receiving time-discrete signal bursts preceded by a preamble signal having a predefined duration. It may therefore be important that a correct filter function is established within the preamble signal so that a loss of data is substantially avoided.

In order to compensate for process and temperature variations of the RC time constant in the active filter circuit 150, the RC tuning circuit 110 is operated prior and/or during the operation of the switched capacitor circuit 100. To this end, identical currents are impressed into the capacitor $C_t$ and the resistor $R_t$ and the respective voltage drops are supplied to the comparator circuit 112 in the control circuit 111. The comparator circuit 112 then provides an output signal indicating the RC time constant defined by $C_t$ and $R_t$ by, for example, two successive rising edges of a signal output by a corresponding comparator unit. A more detailed discussion of the RC tuning circuit 110 is disclosed in the German Patent Application 10156027, which is herewith incorporated by reference. The control logic 113 may then create a corresponding control signal at the output 114 to activate a respective number of switches 156 to couple an appropriate number of the capacitors 155 to the amplifiers 151a . . . 151n so as to compensate for a deviation of the design value of the filter feedback network 153 with respect to the actually measured circuit inherent RC time constant represented by $R_t C_t$. Thus, the time interval T between the two rising edges represents a time specific constant, which of course depends on process and temperature variations, of the sheet resistance material used in the switched capacitor circuit 100 and the specific capacitance obtained from the technology involved in fabricating the circuit 100.

On the basis of the measured time T the control logic 113 generates a corresponding control signal output by terminal 114 to activate an appropriate number of switches 156 to selectively connect capacitors 155 to the filter feedback network 153, thereby substantially compensating for a deviation of the currently prevailing RC time constant from a design value. It should be appreciated that the accuracy of the compensation depends on the number of available switchable capacitors 155 in the filter feedback network 153 and is selected so to reliably maintain the filter behaviour within a predefined tolerance.

In addition to tuning the feedback network 153 the bias current is provided by the constant GM circuit 170 to the amplifiers 151a . . . 151n, thereby substantially compensating for a temperature dependence of the input stages 152. As previously noted, the transconductance of the input stages 152 varies substantially as that of the transistor 177 and therefore is substantially determined by a variation of the resistor 178. Once the feedback network 153 is adjusted, the frequency behaviour $F_t$, such as the settling time of the circuit 150, is then substantially determined by the resistance value of the resistor 178 and the capacitance seen by the amplifiers 151a . . . 151n. A signal may then be provided to the resistor 154 and a corresponding filter response is obtained at the output of the amplifier 151n and may be used for further processing in subsequent circuit stages (not shown).

Although the switched capacitor circuit 100 as described with reference to FIG. 1 allows to compensate to a certain degree for temperature and process induced variations, there is still a variation of the resistor 178 and of the actually applied load capacitance, and thus of the frequency behaviour Ft, so that the bias current supplied to the amplifiers 151a . . . 151n has to be selected to ensure proper operation of the active filter circuit 150 for these process and temperature variations.

In view of the problems explained above, there is a need for an improved bias supply for a switched capacitor circuit, in which temperature and other environmental variations as well as process induced variations are effectively suppressed.

SUMMARY OF THE INVENTION

Generally, the present invention is based on the inventors finding that measurement and calibration results obtained during tuning a switched capacitor circuit may be used to tune a constant GM bias circuit in order to efficiently compensate for environmental fluctuations, such as temperature variations, and for process induced variations, while at the same time a minimum required bias current is supplied to transconductance amplifier stages in the switched capacitor circuit. The calibration and measurement results obtained for the circuit inherent RC time constant may be used in combination with a tunable resistor block and/or a tunable circuit for adjusting a width ratio of transistor in the constant GM circuit to correspondingly modify the effective transconductance in the constant GM circuit.

According to one illustrative embodiment, a bias current circuit for a transconductance amplifier having two input transistors with a predefined design length comprises a constant transconductance circuit. The constant transconductance circuit includes a first and a second transistor having substantially the same design length than the input transistors, wherein the second transistor has a transistor width greater than the first transistor. The constant transconductance circuit further includes a regulation circuit configured to flow substantially identical currents through the first and second transistors and output a bias current for the transconductance amplifier. Additionally; the constant transconductance circuit includes a tunable resistor block connected to the source of the second transistor.

In a further illustrative embodiment, a bias current circuit for a transconductance amplifier having two input transistors with a predefined design length comprises a constant transconductance circuit including a regulation circuit configured to output a bias current for the transconductance amplifier. The constant transconductance circuit further includes at least one first and a plurality of second transistors, wherein the plurality of second transistors are arranged to be selectively connectible in parallel to each other. The constant transconductance circuit further includes a resistor arranged in a common source line of the second transistors that are connected in parallel.

In a further illustrative embodiment, an integrated switched capacitor circuit comprises a transconductance amplifier and a plurality of capacitors connected to the transconductance amplifier, wherein at least one of these capacitors are switchable. An RC tuning circuit is provided and is configured to determine an RC time constant of the switched capacitor circuit and to switch the at least one of the capacitors on the basis of the determined RC time constant. Moreover, the switched capacitor circuit comprises a tunable constant transconductance circuit that is configured to provide a bias to the transconductance amplifier on the basis of the determined RC time constant.

In accordance with still another embodiment, a method of tuning the frequency behaviour of a transconductance amplifier in an integrated switched capacitor circuit comprises obtaining a signal indicative of an RC time constant defined by a current environmental condition and a process technology used for manufacturing the integrated surge capacitor circuit. Then, a tunable resistor block is adjusted in a constant transconductance circuit in response to the signal to tune a bias current supplied to the transconductance amplifier.

BRIEF DESCRIPTION OF THE DRAWINGS

Further advantages, objects and embodiments of the present invention are defined in the appended claims and will become more apparent with the following detailed description when taken with reference to the accompanying drawings, in which:

DETAILED DESCRIPTION

Figure 1:
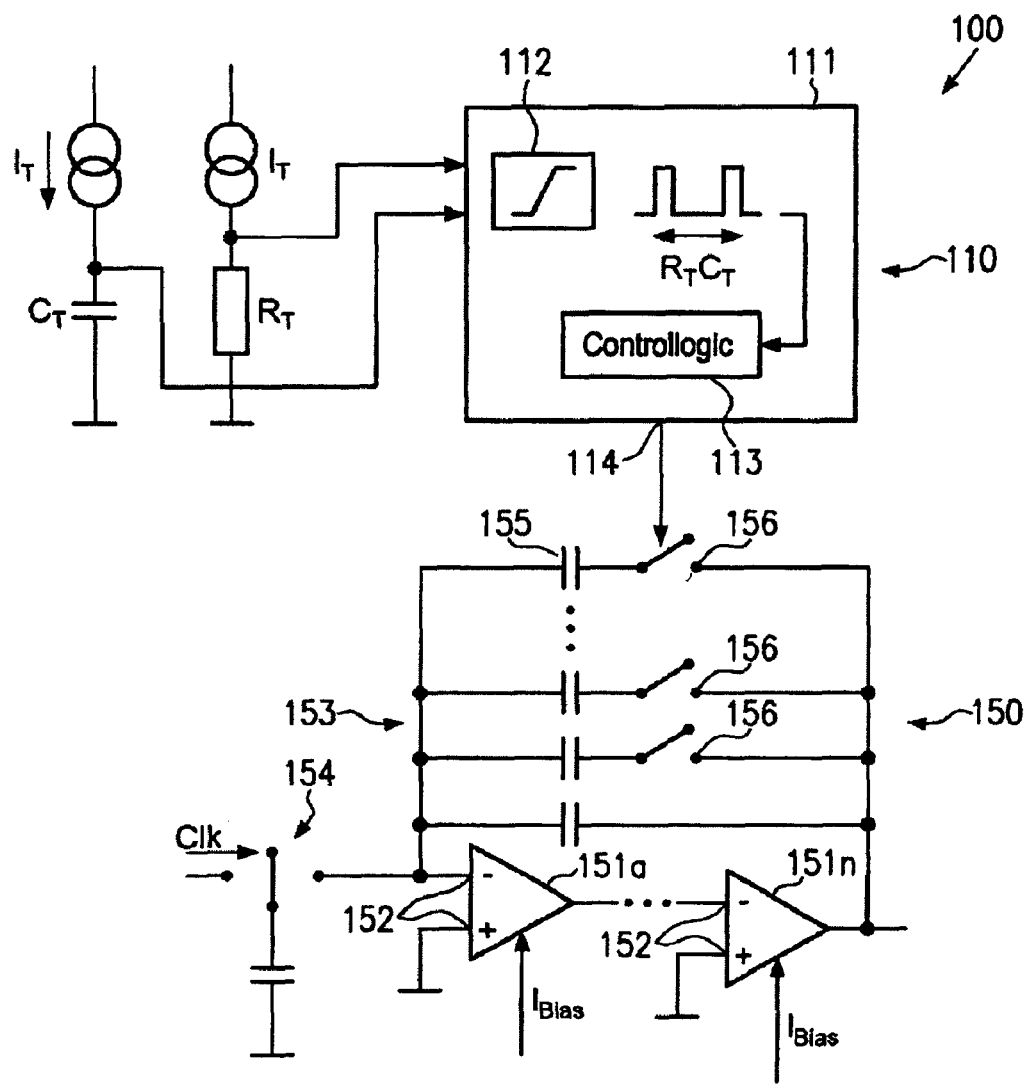
FIG. 1 is a circuit diagram illustrating an example of a conventional switched capacitor circuit including a tunable capacitive feedback network coupled to a capacitor tuning circuit, and a constant GM circuit.
Figure 1:
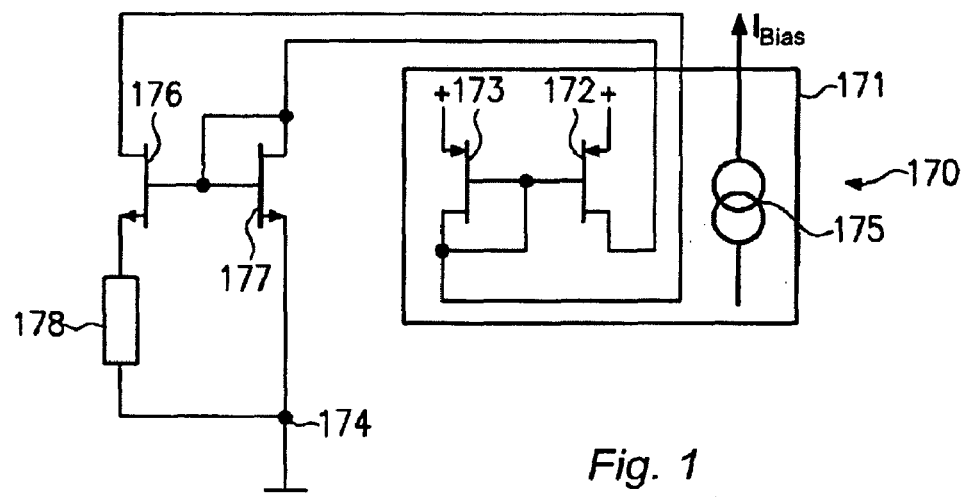

While the present invention is described with reference to the embodiments as illustrated in the following detailed description as well as in the drawings, it should be understood that the following detailed description as well as the drawings are not intended to limit the present invention to the particular illustrative embodiments disclosed, but rather the described illustrative embodiments merely exemplify the various aspects of the present invention, the scope of which is defined by the appended claims.

As previously explained with reference to FIG. 1, the frequency behaviour of a transconductance amplifier biased by a constant GM circuit is substantially determined by:

$$F_t \sim 1/(R \times C) \times A$$

wherein A represents the width ratio and R and C may represent the specific values for the resistive material of which the resistor in the constant GM circuit is comprised of and C represents the specific capacitance defined by the design and the technology used for manufacturing the capacitors in the circuit. Of course, environmental influences may lead to a variation of the RC time constant. This time constant, however, is represented by a measurement value T provided by a capacitor tuning circuit, such as the RC tuning circuit 110, so that the measurement value T may be used to define a frequency correction value, indicated as K, in the form:

$$K = \text{constant}/(R \times C)$$

wherein constant includes any process related constant contributions, such as different sizes of the resistors and capacitors used for measuring the time T compared to circuit elements actually used in the switched capacitor circuit and/or the constant GM circuit. By using the correction value K to modify the resistance value and/or the ratio of the transistor width, i.e. the number A, the frequency behaviour indicated by $F_t$, may be adapted to the currently effective environmental conditions and technology variations. For modifying the constant GM circuit in conformity with the correction value derived from a measurement a tunable element may be provided in the constant GM circuit, for example comprising a tunable resistor block and/or a tunable transistor element, so as to obtain a switched capacitor circuit exhibiting a minimal sensitivity to variations of the environmental conditions, such as the operating temperature, and process induced tolerances, while at the same time the bias current supplied to the operational transconductance amplifiers may be maintained at a minimum required level.

Figure 2A:
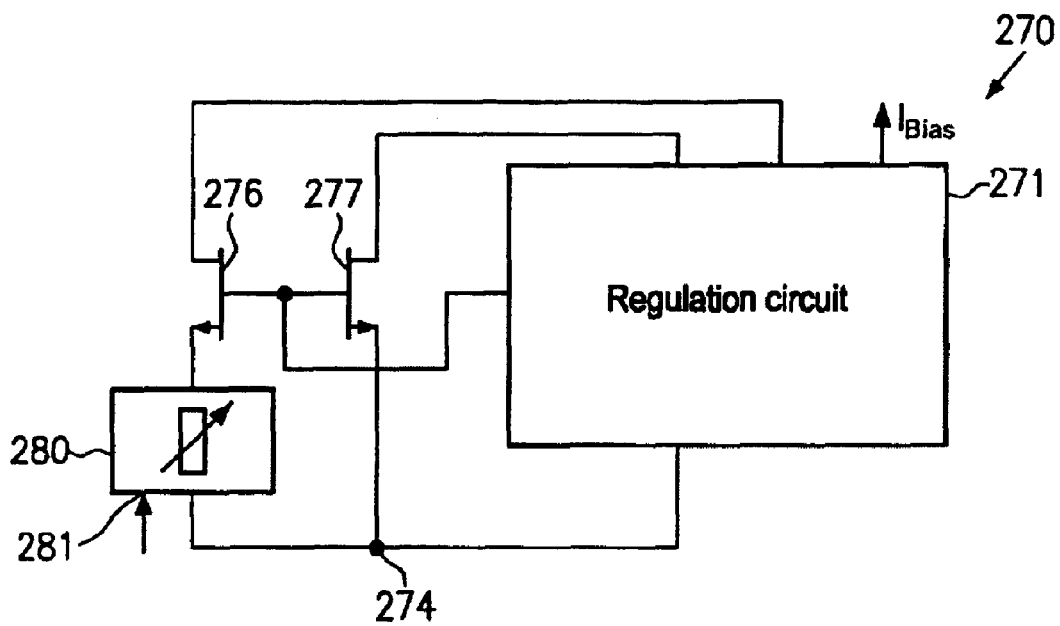
FIG. 2a schematically shows a circuit diagram presenting a constant GM circuit including a tunable resistor block in accordance with one illustrative embodiment.

FIG. 2a is a circuit diagram schematically illustrating a constant GM circuit 270 according to one embodiment, which may be used as a bias current circuit in a switched capacitor circuit. The constant GM circuit 270 comprises a first transistor 277 and a second transistor 276, having substantially the same length but differing in their width, wherein a ratio thereof is indicated by a number A, similarly as in the constant GM circuit 170 described with reference to FIG. 1. Contrary to the conventional arrangment of FIG. 1, a tunable resistor block 280 is included in the source line of the second transistor 276. The tunable resistor block 280 comprises a control input 281 for receiving a control signal that is used to adjust the tunable resistor block 280 in accordance with the correction value K, described above. In some embodiments, the control signal may be a digital signal allowing a suitable adjustment of the tunable resistor block 180. In other embodiments, the control signal may be an appropriately shaped analog signal that provides for the desired adjustment of the tunable resistor block 280. Additionally, the constant GM circuit 270 comprises a regulation circuit 271, which may be configured as the regulation circuit 171 described with reference to FIG. 1.

In operation, the control signal is supplied to the control input 281, for example in an initial phase of the operation, on a regular basis or continuously, to adjust the transconductance of the first and second transistors 277, 276 wherein the control signal may be established on the basis of a correction value obtained by measuring a presently prevailing RC time constant within an integrated circuit. Depending on the "resolution" of the tunable resistor block 280 the transconductance may be readjusted so as to provide a bias current to other circuit stages that is substantially independent from process variations and environmental conditions with a precision given by the resolution of the tunability of the resistor block 280.

Figure 2B:
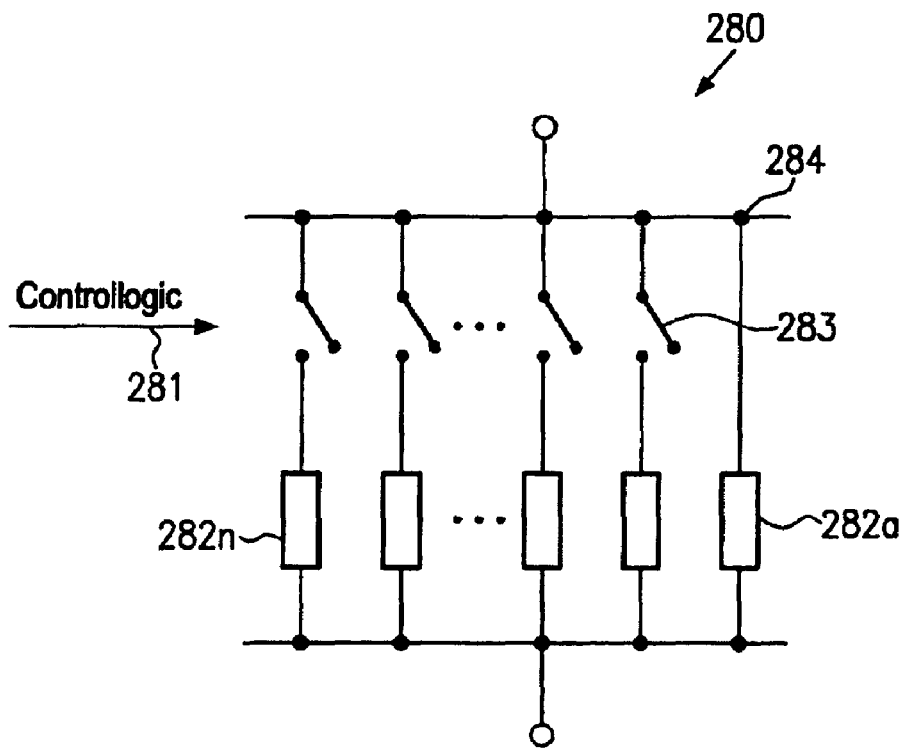
FIG. 2b schematically shows one particular embodiment of a tunable resistor block of a constant GM circuit.

FIG. 2b schematically shows an example of an arrangement of the tunable resistor block 280 of FIG. 2a. The tunable resistor block 280 comprises a plurality of resistors 282a ... 282n, which may have resistance values such that the mutual ratio of the resistances is well defined and known. At least some of the resistors 282a ... 282n are connected to a common node 284 by switches 283 that are actuable by the control signal supplied to the control input 281. Controllable switches, for example in the form of field effect transistors, are well known in the art and thus a description thereof will be omitted.

In operation, the control signal supplied at the control input 281, which may be based on, for example, the correction value K, as previously explained, actuates a required number of the resistors 282a ... 282n to compensate for deviations caused by process variations and/or changes of the environmental conditions. In one embodiment, the resistors 282a may be formed by substantially identical "unit" resistors, wherein a specific resistance of a respective resistor 282a ... 282n is obtained by appropriately combining a plurality of the unit resistors in a parallel and/or serial fashion to obtain a required design value for the resistance. In the simplest case, the resistors 282a ... 282n may have substantially identical resistance values, wherein the achievable precision in tuning the resistor block 280 is then determined by the total number of resistors provided. Since the resistors 282a ... 282n, irrespective whether they are composed of a plurality of unit resistors or not, are fabricated by the same technological processes and are fabricated in close proximity to each other, any technological process variations and/or environmental changes may affect all of the resistors 282a ... 282n in a substantially identical manner so that the corresponding ratios of the resistance values is substantially constant.

Figure 3:
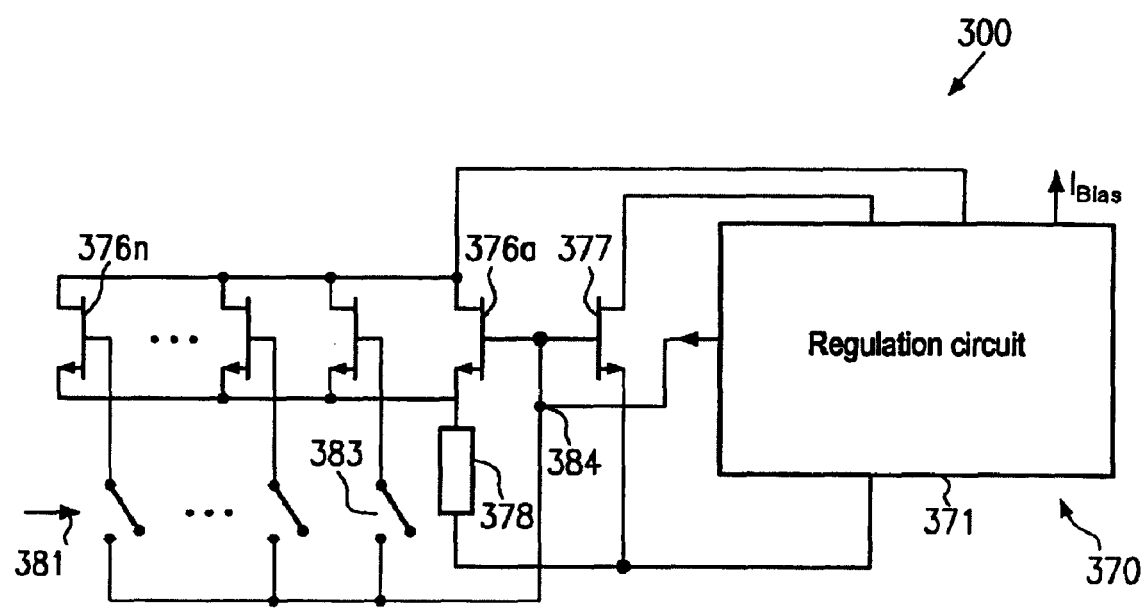
FIG. 3 shows a circuit for adjusting a width ratio of transistors in a constant GM circuit according to a further illustrative embodiment.

FIG. 3 shows a circuit diagram in accordance with a further illustrative embodiment, wherein the ratio of the transistor width in a constant GM circuit is tunable. A constant GM circuit 370 comprises a regulation circuit 371, which may have substantially the same configuration as already described with reference to FIGS. 1 and 2. A first transistor 377 and a plurality of second transistors 376a ... 376n are provided, wherein the plurality of second transistors 376a ... 376n are connected in parallel and a resistor 378 is provided in the common source line. At least some of the second transistors 376a ... 376n are selectively switchable by switches 383 provided in respective gate lines of these transistors. Thus, by activating one of the switches 383 the gate of a corresponding second transistor is connected to a common gate voltage node 384. The switches 383 are connected to a control input 381.

In operation, a control signal may be supplied to the control input 381 to select a specific number of switches 383 to readjust the effective ratio of transistor widths of the first transistor 377 and the plurality of second transistors 376a ... 376n. As previously noted, the transconductance of the constant GM stage 370 is proportional to the ratio of the width of the first and second transistors and is inversely proportional to the resistance of the resistor 378. Thus, a variation of the circuit inherent RC time constant may also be compensated on the basis of the correction value K by modifying the transistor width ratio.

It should be noted that with respect to the number and configuration of the second transistors 376a ... 376n substantially the same criteria apply as already pointed out with reference to the tunable resistor block 280. That is, the second transistors may have substantially the same dimensions, i.e. a length that is substantially identical to the length of the first transistor 377 and a width that is designed to obtain a required "resolution" for the tunability of the constant GM circuit 370. For example, the second transistors 376a ... 376n may be comprised of substantially identical "unit" transistors wherein a required number of unit transistors is connected in parallel with a common gate line that is activated by a single switch 383. In other embodiments, a required number of substantially identical second transistors 376 may be provided, each of which is activated by a corresponding switch 383. In one particular embodiment, the first transistor 377 and the second transistors 376a ... 376n are formed of substantially identical unit transistors, which may have the same dimensions as the transistors used in an input stage of an operational transconductance amplifier that is to be biased by the constant GM circuit 370.

It should be appreciated that alternatively the second transistors 376a ... 376n may be selectively connected with each other by providing corresponding switches in the drain or source line of these transistors. Moreover, in some applications it may be appropriate to provide a plurality of first transistors 377, at least some of which may be switchable to provide for a higher degree of resolution for adjusting the ratio A of the transistor widths.

Figure 4:
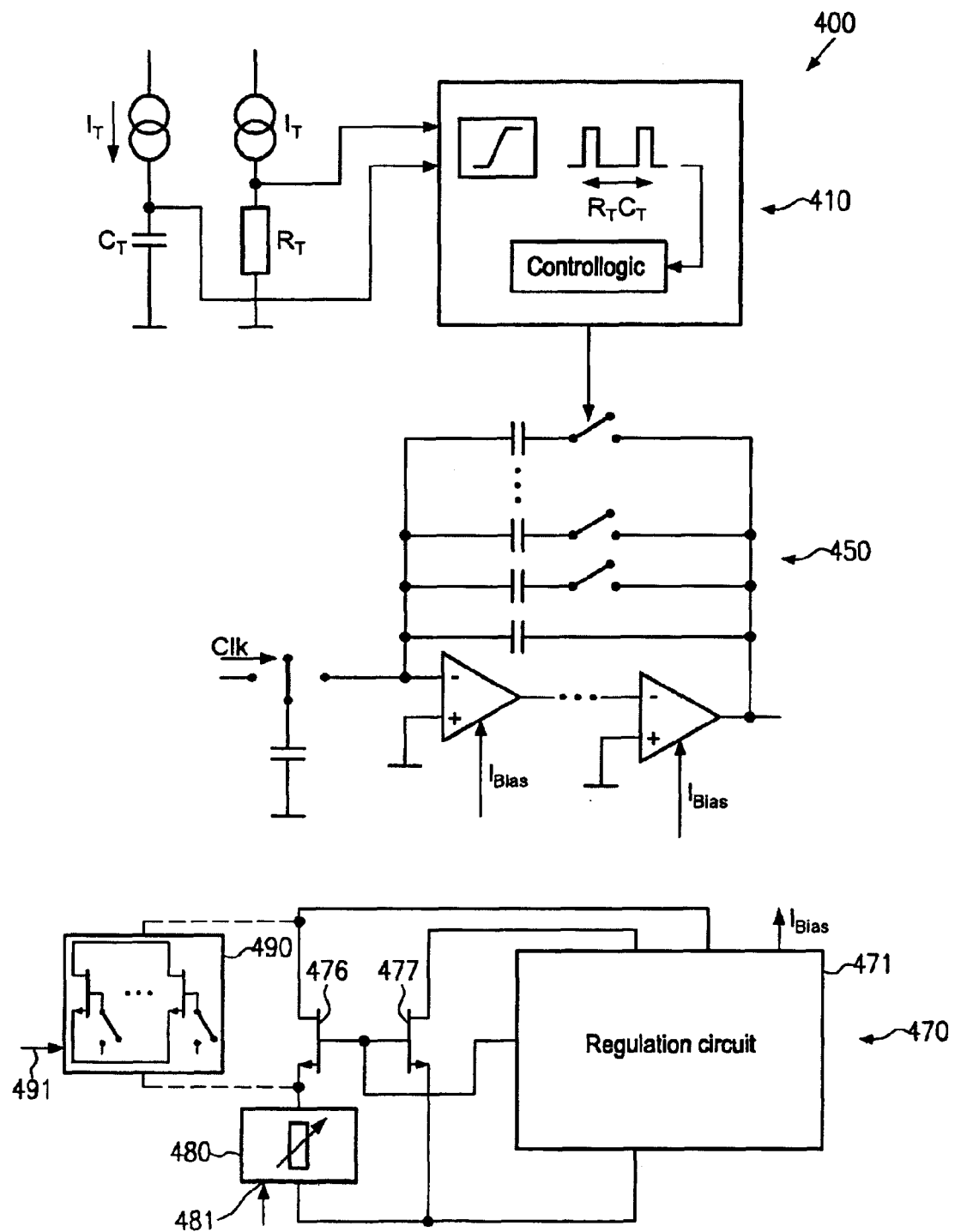
FIG. 4 is a circuit diagram representing a switched capacitor circuit including a constant GM circuit according to still a further illustrative embodiment.

FIG. 4 is a circuit diagram of a switched capacitor circuit 400 including an active filter circuit 450, an RC tuning circuit 410 and a constant transconductance circuit 470, wherein the transconductance thereof is tunable upon applying an appropriate control signal. The RC tuning circuit 410 and the active filter circuit 450 may be configured as previously described with reference to FIG. 1 and any criteria pointed out there also apply for the circuit 410 and 450 of the present embodiment. The constant transconductance circuit 470 comprises a regulation circuit 471, a first transistor 477 and a second transistor 476. Moreover, a tunable resistor block 480 including a control input 481 may be provided in the source line of the second transistor 476. The tunable resistor block 480 may be configured in a similar fashion as already described with reference to FIGS. 2a and 2b. In another embodiment, a switchable transistor block 490 having a control input 491 may be provided additionally or alternatively, wherein the tunable transistor block 490 may be configured in a similar way as described with reference to FIG. 3.

In operation, a control signal may be applied to the control input 481 and/or 491 to adapt the transconductance and thus the bias current to a desired value. Advantageously, the control signal supplied to the control input 481 and/or 491 is derived from a correction value such as the value K, which in turn is based on a measurement of a circuit inherent RC time constant, so as to allow to adjust the frequency behaviour $F_t$ of the active filter circuit 450 to a defined value or range, or to keep the frequency behaviour, for example the settling time of the active filter circuit 450, within a specified range, thereby effectively compensating for changes of the environmental conditions, such as temperature variations, and technological variations.

Further modifications and variations of the present invention will be apparent to those skilled in the art in view of this description. Accordingly, the description is to be construed as illustrative only and is for the purpose of teaching those skilled in the art the general manner of carrying out the present invention.

What is claimed is:

1. A bias current circuit for a transconductance amplifier having two input transistors with a predefined design length, the bias circuit comprising:
   a constant transconductance circuit including:
   a first and a second transistor having substantially the same design length than said input transistors, the second transistor having a transistor width greater than the first transistor;
   a regulation circuit configured to flow substantially identical currents through said first and second transistors and output a bias current for said transconductance amplifier; and
   a tunable resistor block connected to the source of the second transistor.

2. The bias current circuit of claim 1, wherein said tunable resistor block includes a plurality of resistors, at least some of which are selectively connectible to a source terminal of said second transistor.

3. The bias current circuit of claim 2, wherein at least one of said plurality of switchable resistors comprises a plurality of substantially identical unit resistors.

4. The bias current circuit of claim 2, wherein said plurality of switchable resistors have substantially the same design resistance value.

5. A bias current circuit for a transconductance amplifier having two input transistors with a predefined design length, the bias circuit comprising:
   a constant transconductance circuit including:
   a regulation circuit configured to output a bias current for said transconductance amplifier;
   at least one first and a plurality of second transistors, wherein said plurality of second transistors are arranged to be selectively connectible in parallel to each other, and a resistor arranged in a common source line of said second transistors connected in parallel.

6. The bias current circuit of claim 5, further comprising a plurality of controllable switches connected with one end to a gate electrode of one or more of said second transistors, and connected with the other end to a common reference voltage source for the first and the second transistors.

7. The bias current circuit of claim 5, wherein a plurality of controllable switches is provided in at least one of a source line and a drain line of one or more of said second transistors.

8. The bias current circuit of claim 5, wherein each of said second transistors is comprised of one or more unit transistors.

9. An integrated switched capacitor circuit comprising:
   a transconductance amplifier;
   a plurality of capacitors connected to said transconductance amplifier, at least one of the capacitors being switchable;
   an RC tuning circuit configured to determine an RC time constant in said switched capacitor circuit and to switch said at least some of the capacitors on the basis of the determined RC time constant; and
   a tunable constant transconductance circuit configured to provide a bias to said transconductance amplifier on the basis of the determined RC time constant.

10. The integrated switched capacitor circuit of claim 9, wherein said tunable constant transconductance circuit comprises:
    a regulation circuit configured to output a bias current to said transconductance amplifier;
    a first and a second transistor having substantially the same design length than input transistors of said transconductance amplifier; and
    a tunable resistor block provided in the source line of said second transistor.

11. The integrated switched capacitor circuit of claim 10, wherein said tunable resistor block includes a plurality of resistors, at least some of which are selectively connectible to a source terminal of said second transistor.

12. The integrated switched capacitor circuit of claim 11, wherein at least one of said plurality of switchable resistors comprises a plurality of substantially identical unit resistors.

13. The integrated switched capacitor circuit of claim 11, wherein said plurality of switchable transistors have substantially the same design resistance value.

14. The integrated switched capacitor circuit of claim 9, wherein said tunable constant transconductance circuit comprises:
    a transconductance amplifier;
    a plurality of capacitors connected to said transconductance amplifier, at least one of the capacitors being switchable;
    a regulation circuit configured to output a bias current to said transconductance amplifier; and
    at least one first transistor and a plurality of second transistors, the first and second transistors having substantially the same design length as input transistors of said transconductance amplifier, wherein said second transistors are arranged to be selectively connectible in parallel to each other.

15. The integrated switched capacitor circuit of claim 14, further comprising a plurality of controllable switches connected with one end to a gate electrode of one or more of said second transistors, and connected with the other end to a common reference voltage source for the first and the second transistors.

16. The integrated switched capacitor circuit of claim 14, wherein a plurality of controllable switches is provided in at least one of a source line and a drain line of one or more of said second transistors.

17. The integrated switched capacitor circuit of claim 14, wherein each of said second transistors is comprised of one or more unit transistors.

18. A method of tuning the frequency behaviour of a transconductance amplifier in an integrated circuit, the method comprising:
    obtaining a signal indicative of an RC time constant associated with said integrated circuit, and
    adjusting at least one of a resistance value and a ratio of transistor widths in a constant transconductance circuit in response to said signal to adjust a bias current supplied to said transconductance amplifier.

19. The method of claim 18, wherein obtaining said signal indicative of an RC time constant includes measuring said RC time constant and determining a correction value for said RC time constant.

20. The method of claim 19, wherein adjusting at least one of a resistance value and a ratio of transistor widths includes generating a digital control signal for selectively activating a plurality of switches.

21. The method of claim 18, wherein said resistance value is adjusted by selectively connecting a plurality of resistors in a parallel manner by controlling a plurality of switches associated with said plurality of resistors.

* * * * *